(12) United States Patent
Voldman et al.

(10) Patent No.: US 7,348,251 B2
(45) Date of Patent: Mar. 25, 2008

(54) MODULATED TRIGGER DEVICE

(75) Inventors: Steven H. Voldman, South Burlington, VT (US); Michael J. Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 11/201,023

(22) Filed: Aug. 10, 2005

(65) Prior Publication Data

US 2005/0280093 A1 Dec. 22, 2005

Related U.S. Application Data

(62) Division of application No. 10/707,289, filed on Dec. 3, 2003, now Pat. No. 6,975,015.

(51) Int. Cl.
*H01L 29/66* (2006.01)
(52) U.S. Cl. .................................. 438/405; 438/174
(58) Field of Classification Search ................ 257/355, 257/360, 361; 438/174, 405
See application file for complete search history.

(56) References Cited

U.S. PATENT DOCUMENTS

| 4,992,844 | A | * | 2/1991 | Yakushiji | 257/140 |
| 5,929,478 | A | | 7/1999 | Parris et al. | |
| 6,429,723 | B1 | * | 8/2002 | Hastings | 327/536 |
| 6,864,152 | B1 | * | 3/2005 | Mirbedini et al. | 438/427 |
| 2002/0105021 | A1 | * | 8/2002 | Myono et al. | 257/299 |
| 2002/0149029 | A1 | * | 10/2002 | Wu et al. | 257/173 |

* cited by examiner

*Primary Examiner*—Thomas L. Dickey
(74) *Attorney, Agent, or Firm*—Schmeiser, Olsen & Watts; Michael LeStrange (57) ABSTRACT

An integrated circuit structure, a trigger device and a method of electrostatic discharge protection, the integrated circuit structure including: a substrate having a top surface defining a horizontal direction, the substrate of a first dopant type; a first horizontal layer in the substrate, the first layer of a second dopant type; and a second horizontal layer of the first dopant type, the second layer on top of the first layer and between the top surface of the substrate and the first layer, the second layer electrically modulated by the first layer.

7 Claims, 12 Drawing Sheets

MODULATED TRIGGER DEVICE

This application is a divisional of Ser. No. 10/707,289; filed on Dec. 3, 2003 now U.S. Pat. No. 6,975,015.

BACKGROUND OF INVENTION

1. Field of the Invention

The present invention relates to the field of integrated circuits; more specifically, it relates to a modulated trigger device and the method of fabricating the device.

2. Background of the Invention

Trigger circuits are used in electrostatic discharge (ESD) protection circuits, voltage clamping circuits and numerous other circuits when an event must be detected and reacted to quickly.

SUMMARY OF INVENTION

A first aspect of the present invention is an integrated circuit structure, comprising: a substrate having a top surface defining a horizontal direction, the substrate of a first dopant type; a first horizontal layer in the substrate, the first layer of a second dopant type; and a second horizontal layer of the first dopant type, the second layer on top of the first layer and between the top surface of the substrate and the first layer, the second layer electrically modulated by the first layer.

A second aspect of the present invention is a trigger device comprising: a lateral MOSFET comprising a source, a drain, a gate and a body; a modulating layer under and in contact with the body; a first vertical bipolar transistor comprising the source, the body and the modulating layer; and a second vertical bipolar transistor comprising the drain, the body and the modulating layer.

A third aspect of the present invention is a method of electrostatic discharge protection, comprising: providing trigger device comprising: a MOSFET having a source, drain, gate and a body in a substrate; a modulator under and in contact with the body; a first vertical bipolar transistor comprising the source, a body and a modulator; and a second vertical bipolar transistor comprising the drain, body and modulator; coupling the modulator to the substrate and to an I/O pad; and coupling the modulator and the drain to an input gate, to a double gated diode pair and an input gate network or to a clamping network.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

The trigger device of the present invention is easily co-fabricated and integrated into many of today's technologies. For example, the trigger device of the present invention may be fabricated on the same integrated circuit chip as CMOS, BiCMOS, BiCMOS Si, BiCMOS SiGe and BiC-MOS SiGeC devices sharing CMOS, BiCMOS, BiCMOS Si, BiCMOS SiGe and BiCMOS SiGeC technology process steps.

Figure 1:
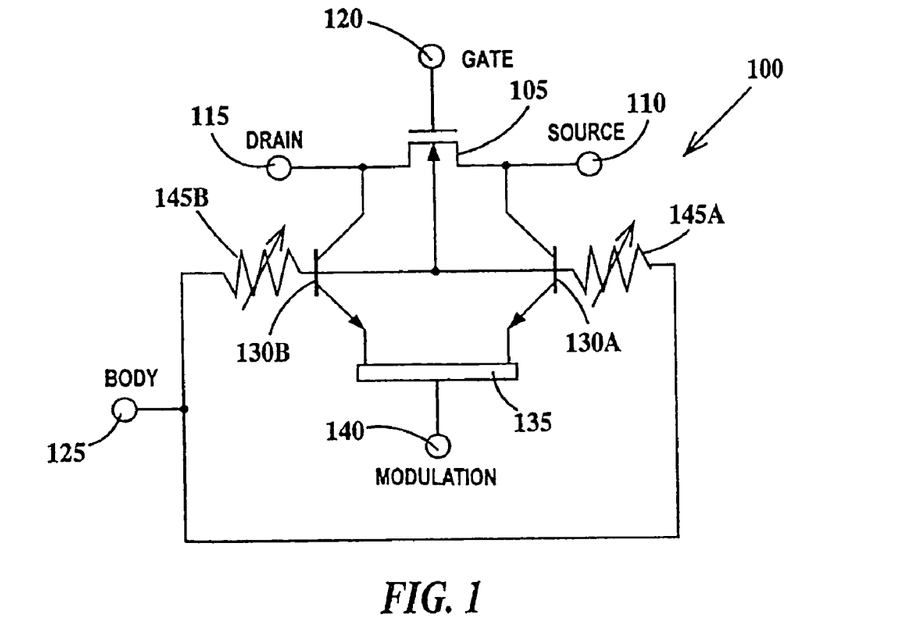
FIG. 1 is a schematic diagram of a trigger device according to the present invention.

FIG. 1 is a schematic diagram of a trigger device according to the present invention. In FIG. 1, a trigger device 100 includes an N-channel field effect transistor (NFET) 105, having a source contact 110, a drain contact 115, a gate contact 120 and a body contact 125. Trigger device 100 further includes vertical NPN bipolar transistors (NPN) 130A and 130B. The collector of NPN 130A is the source of NFET 105 and the collector of NPN 130B is the drain of NFET 105. The base of NPNs 130A and 130B are the body of NFET 105. The emitters of NPNs 130A and 130B are N-type modulator 135 under the body of NFET 105 as described infra. A modulation contact 140 is connected to modulator 135. Depending upon the technology of the primary devices of an integrated circuit, modulator 135 can be formed concurrently with formation of a triple well CMOS n-band, a bipolar subcollector, a buried n-layer or a SiGe pedestal structure. Two variable resistors 145A and 145B, which are structurally paths in the body of NFET 105 to body contact 125, are connected respectively between the collectors of NPNs 145A and 145B and body contact 125. Variable resistors 145A and 145B are "variable" because a voltage applied to modulation contact 140 physically shrinks the size of the body of NFET 105 in specific regions as described infra. It should be understood, that trigger device 100 is a single solid-state device fabricated in an isolated P-well as described infra.

While trigger device 100 is illustrated as having NFET, NPN bipolar transistor and an N-type modulation layer elements (in an isolated P-well), a trigger device can be fabricated having a P-channel field effect transistor (PFET), PNP bipolar transistor and a P-type modulation layer (in an isolated N-well). In the latter case, the emitters would be source/drains of the PFET and the collector the buried P-type layer. NFETs and PFETs are both examples of metal-oxide-silicon field effect transistors (MOSFETs).

Figure 2:
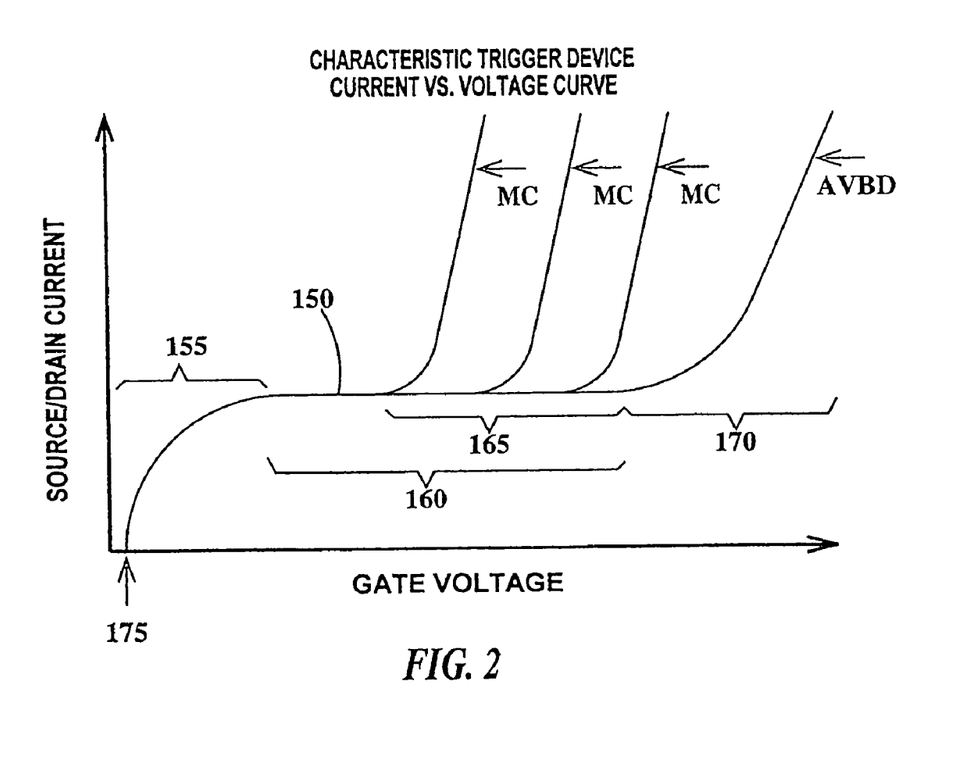
FIG. 2 is a plot of the characteristic trigger device current-voltage curve for a trigger device according to the present invention.

FIG. 2 is a plot of the characteristic trigger device current-voltage curve for a trigger device according to the present invention. In FIG. 2, IV curve 150 has four distinct voltage regions: a turn-on region 155, an operating region 160 (which overlaps a modulation breakdown region 165) and an avalanche breakdown region 170. In turn on region 155, as gate voltage is increased beyond a threshold voltage 175, the current between the source/drain of the NFET portion of the trigger device increases and levels off as the voltage is increased into operating region 160 (with no modulation bias applied to the modulator). As the voltage increases into avalanche breakdown region 170, curve 150 assumes a bipolar-like IV avalanche breakdown characteristic shape depicted as portion AVBD of curve 150.

However, if a modulation bias is applied to the modulator, a family of curves depicted as MC portions of curve 150 (for modulated conduction) are generated which result in a high current flow at a much lower gate voltage. MC portions of curve 150 are due to the vertical NPNs turning on and conducting. Modulation breakdown occurs over a narrow range of gate voltage than the range of gate voltage avalanche breakdown occurs at and has a steeper current/voltage slope. The higher the modulation-bias the lower the voltage at which modulated breakdown occurs. Thus, the trigger voltage (gate voltage) can be precisely tuned. There are several embodiments of the present invention, described infra, that result in curve 150 in the manner just described.

There are also embodiments of the present invention that result in curve 150 with zero modulation bias applied. These embodiments employ a multiple finger NFET with all fingers formed in the same isolated P-well. An example is the fifth embodiment of the present invention illustrated in FIG. 8 and described infra. In these embodiments, the more fingers formed in the same well, the lower the voltage at which modulation breakdown will occur.

Finally, there are embodiments of the present invention in which there is no AVBD portion of curve 150, only an MC portion. In these embodiments, the gate voltage at which MC occurs is a function of the distance of the modulator from the surface of the silicon. An example is the fourth embodiment of the present invention illustrated in FIG. 7 and described infra. In these embodiments, the closer the modulator is to the surface of the silicon, the lower is the voltage that modulation breakdown occurs at.

Figure 3A:
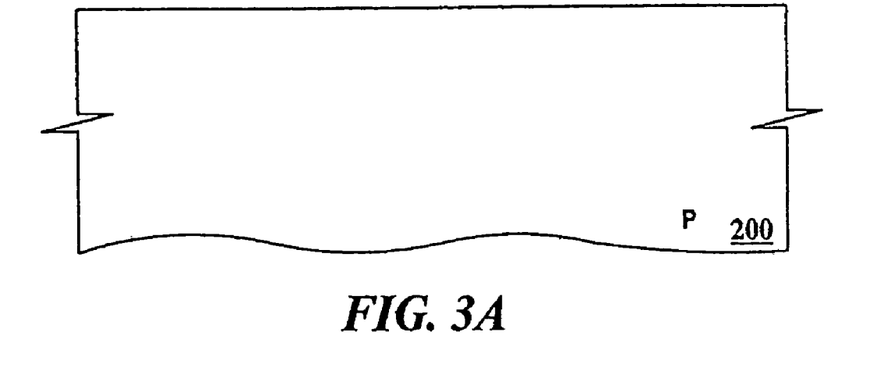
FIGS. 3A through 3D are partial cross-sectional views illustrating a first portion of a first method of the fabrication of the trigger device of the present invention.
Figure 3B:
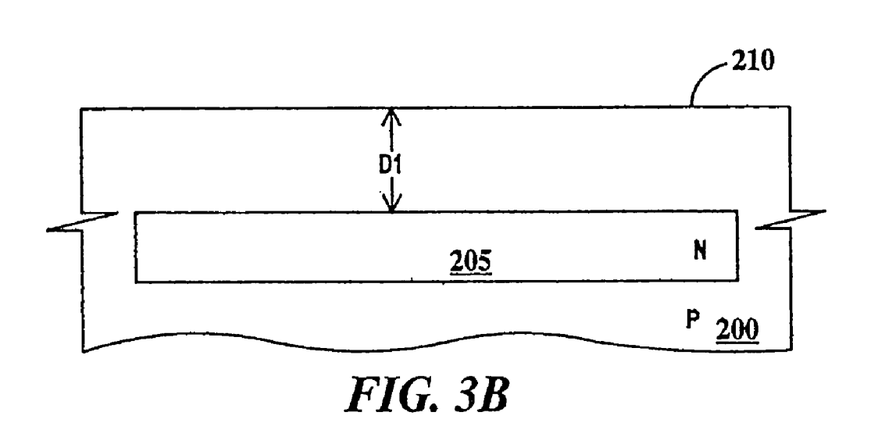
Figure 3C:
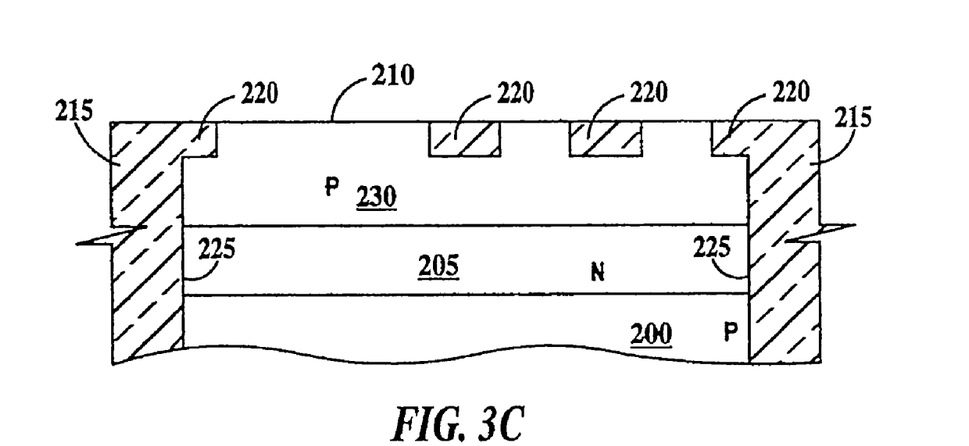
Figure 3D:
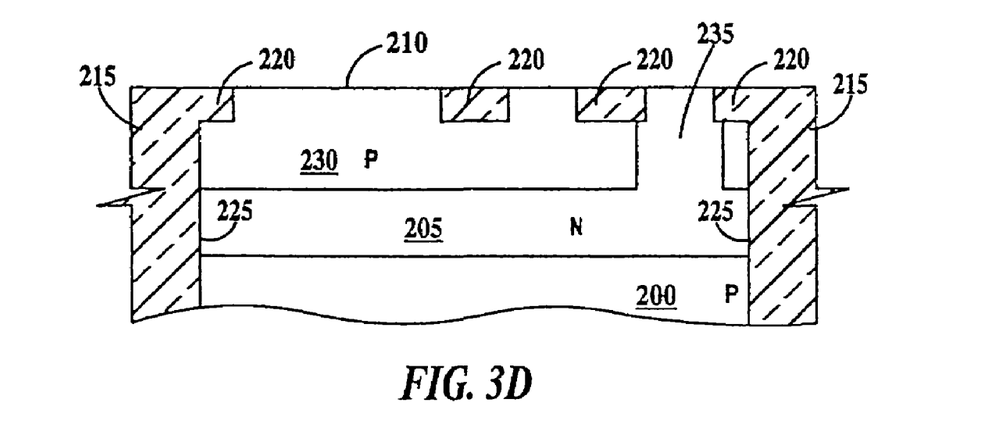

FIGS. 3A through 3D are partial cross-sectional views illustrating a first portion of a first method of the fabrication of the trigger device of the present invention. In FIG. 3A, a P-type substrate 200 is provided having a doping level of about intrinsic to $10^{16}$ atoms/cm$^3$. In FIG. 3B, an N-type implant at a dose of about $10^{12}$ to $10^{17}$ atoms/cm$^2$ at an energy of about 50 KEV to 3 MEV is performed to form modulator 205 a distance "D1" below surface 210 of substrate 200. In BiCMOS this implant may be the subcollector implant of the bipolar device. In one example, "D1" is about 0.2 to 3 microns. In FIG. 3C, deep trench isolation 215 and shallow trench isolation 220 are formed in substrate 200. Deep trench isolation 215 contacts sides 225 of modulator 205. Deep trench isolation 215 and modulator 205 define a body region 230 in substrate 200. In FIG. 3D, an N-type reach through 235 is formed from top surface 210 of substrate 200 to modulator 205. Depending upon the technology of the primary devices of an integrated circuit, modulator 205 can be formed concurrently with formation of a triple well CMOS n-band, a bipolar subcollector, a buried n-layer or a SiGe pedestal structure.

Figure 3E:
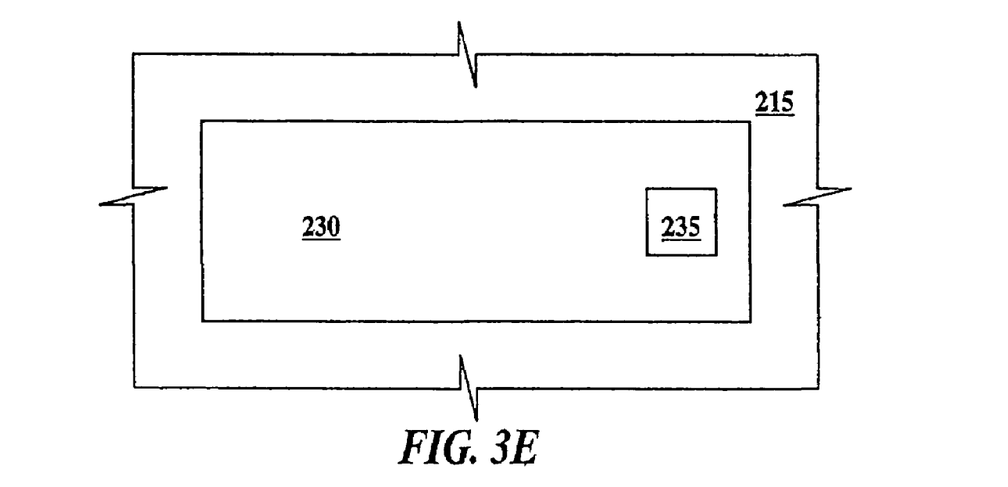
FIG. 3E is a top view of FIG. 3E.

FIG. 3E is a plan view of FIG. 3D. In FIG. 3E, it is apparent that deep trench isolation 215 completely surrounds modulator 205 and thus defines body region 230 and isolates the body region from the rest of substrate 200 (see FIG. 3D). Shallow trench isolation 220 is not illustrated in FIG. 3E for clarity.

Figure 4A:
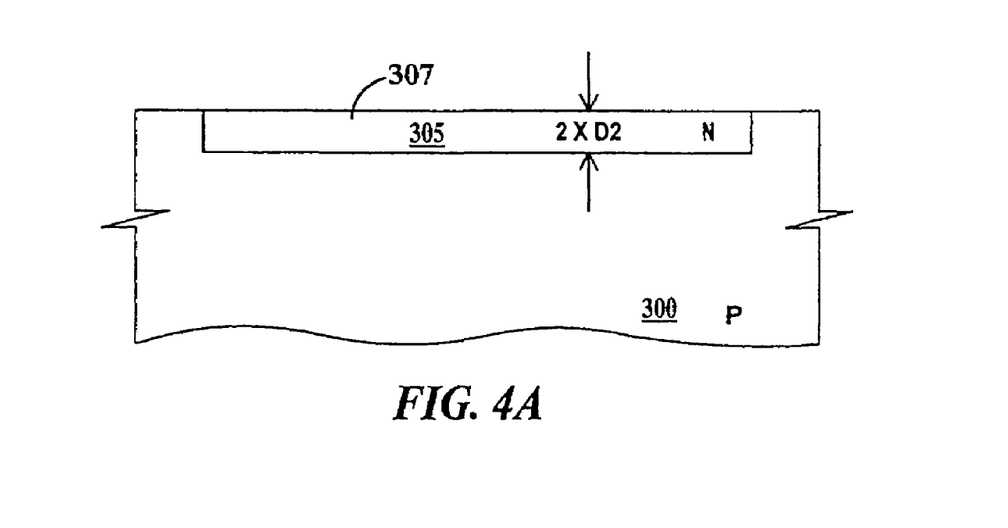
FIGS. 4A through 4D are partial cross-sectional views illustrating a first portion of a second method of the fabrication of the trigger device of the present invention.
Figure 4B:
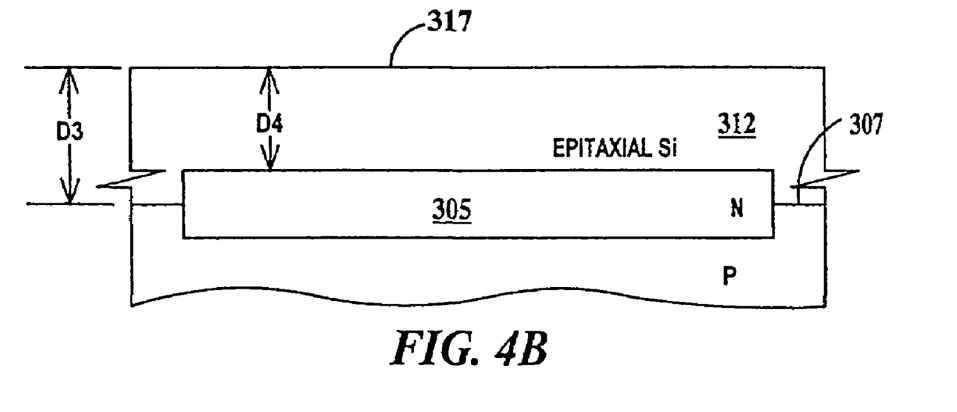
Figure 4C:
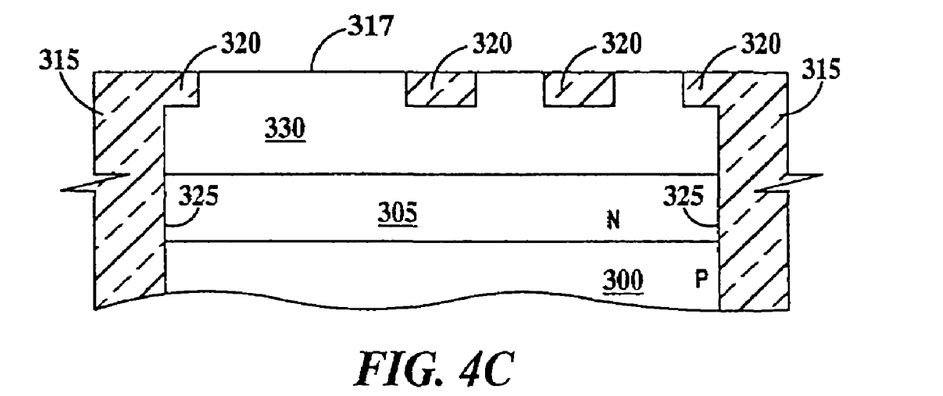
Figure 4D:
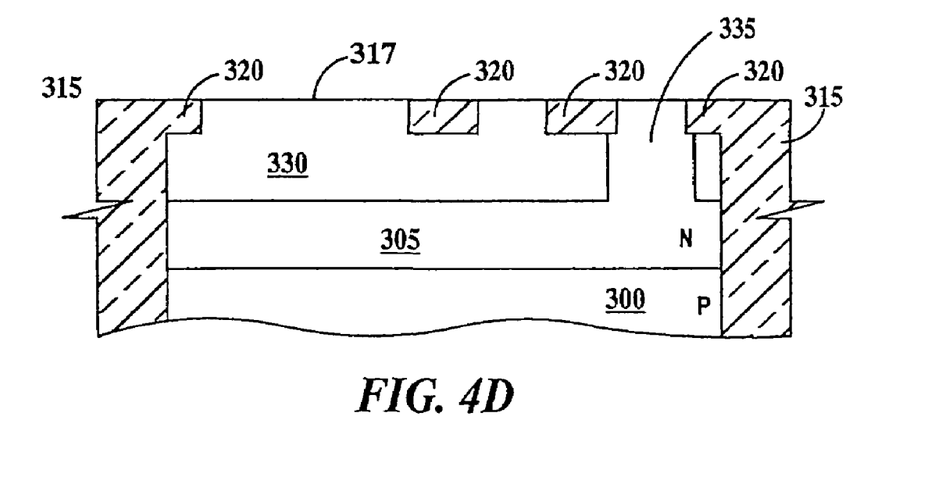

FIGS. 4A through 4D are partial cross-sectional views illustrating a first portion of a second method of the fabrication of the trigger device of the present invention. In FIG. 4A, a P-type substrate 300 is provided having a doping level of about intrinsic to $10^{20}$ atoms/cm$^3$ and an N-type ion implant at a dose of about $10^{12}$ to $10^{17}$ atoms/cm$^2$ at an energy of about 5 KEV to 3 MEV is performed to form modulator 305 a distance "D2" from a top surface 307 of substrate 300 into the substrate. In BiCMOS this implant may be the subcollector implant of the bipolar device. In one example, "D2" is about 0 to 0.5 microns. In FIG. 4B, an epitaxial silicon layer 312 of thickness "D3" is formed on top surface 307 of substrate 300. In one example, "D3" is about 0.2 to 3 microns. Modulator 305 out-diffusions into epitaxial layer 312 so modulator 305 is a distance "D4" from top surface 317 of epitaxial layer 312. In one example, "D4" is about 0.2 to 3 microns. In FIG. 4C, deep trench isolation 315 and shallow trench isolation 320 are formed in substrate 300. Deep trench isolation 315 contacts sides 325 of modulator 305. Depending upon the technology of the primary devices of an integrated circuit, modulator 305 can be formed concurrently with formation of a BiCMOS HBT subcollector or by ion implantation below a bipolar subcollector. Deep trench isolation 315 and modulator 305 define a body region 330 in substrate 300. In FIG. 4D, an N-type reach through 335 is formed from top surface 317 of epitaxial layer 312 to modulator 305. Similarly to what was described supra in reference to FIGS. 3D and 3E, deep trench isolation 315 completely surrounds modulator 305 and thus defines body region 330 and isolates the body region from the rest of substrate 300 and epitaxial layer 312.

The description of the present invention will continue using the first method of fabrication of the trigger device as illustrated in FIGS. 3A through 3D and described supra as an example. The description of the present invention could also be continued using the second method of fabrication as illustrated in FIGS. 4A through 4D as well.

Figure 5A:
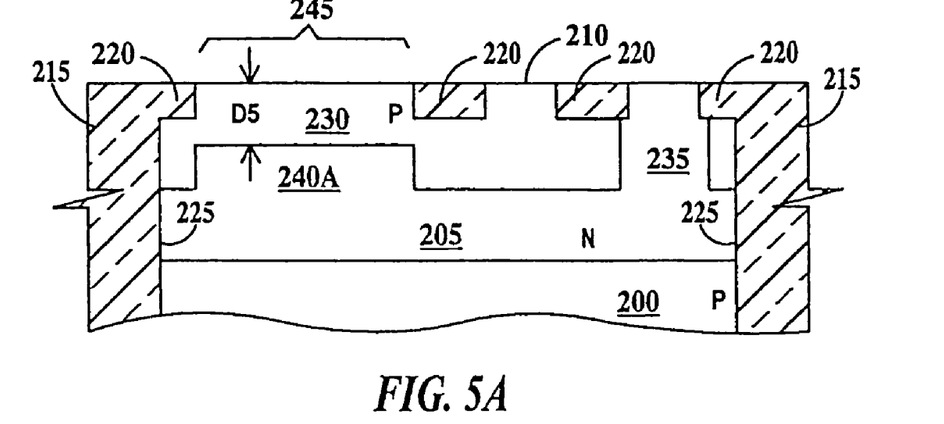
FIG. 5A is a partial cross-sectional view illustrating formation of a structure of a first embodiment of the present invention, common to all methods of fabricating the trigger device of the present invention.
Figure 6A:
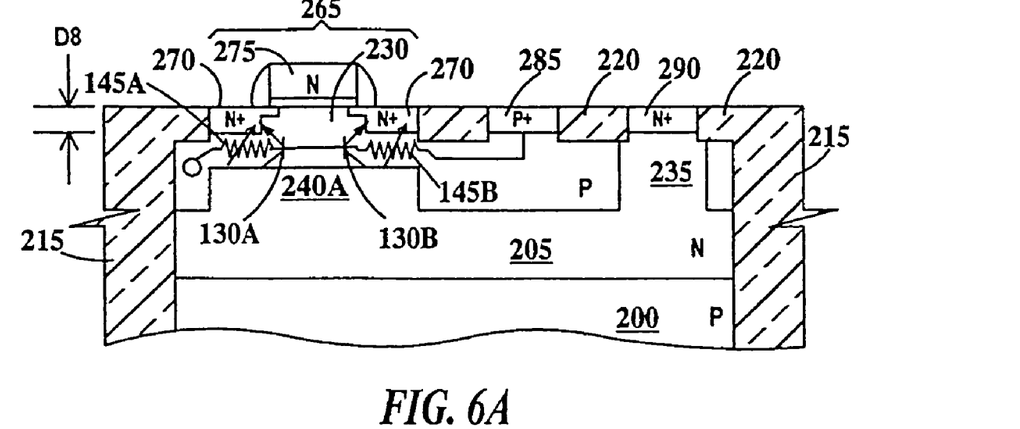
FIGS. 6A, 6B and 6C are a partial cross-sectional views illustrating completion respectively of the first, second and third embodiments of the present invention, common to all methods of fabricating the trigger device of the present invention.

FIG. 5A is a partial cross-sectional view illustrating formation of a structure of a first embodiment of the present invention, common to all methods of fabricating the trigger device of the present invention. In FIG. 5A, a modulator extension 240A is formed under a region 245 where an NFET will be formed (see FIG. 6A). Depending upon the technology of the primary devices of an integrated circuit, modulator extension 240A can be formed concurrently with formation of a bipolar subcollector or a SiGe pedestal structure. An N-type ion implant of a dose of about $10^{12}$ to $10^{20}$ atoms/cm$^2$ at an energy of about 5 KEV to 1 MEV is performed to form modulator extension 240A a distance "D5" from top surface 210 of substrate 200. In one example, "D5" is about 0.2 to 3 microns. Formation of modulator extension 240A is followed by a P-well P-type ion implant of a dose of about $10^{11}$ to $10^{20}$ atoms/cm$^2$ at an energy of about 5 KEV to 3 MEV into body 230. The completed trigger device is illustrated in FIG. 6A and described infra.

Figure 5B:
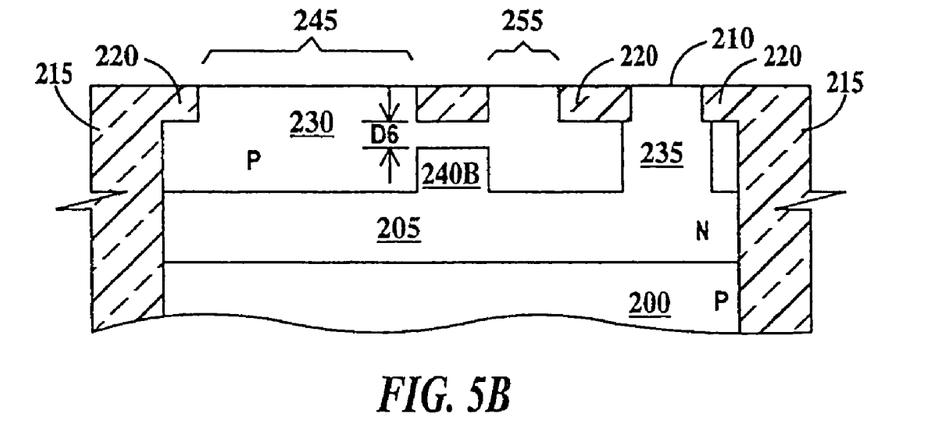
FIG. 5B is a partial cross-sectional view illustrating formation of a structure of a second embodiment of the present invention, common to all methods of fabricating the trigger device of the present invention.

FIG. 5B is a partial cross-sectional view illustrating formation of a structure of a second embodiment of the present invention, common to all methods of fabricating the trigger device of the present invention. In FIG. 5B, a modulator extension 240B is formed between region 245 where an NFET will be formed (see FIG. 6B) and a region 250 where a body contact will be formed. An N-type ion implant of a dose of about $10^{12}$ to $10^{20}$ atoms/cm$^2$ at an energy of about 5 KEV to 1 MEV is performed to form modulator extension 240B a distance "D6" from top surface 210 of substrate 200. In one example, "D6" is about 0 to 2 microns. Formation of modulator extension 240B is followed by a P-well P-type ion implant of a dose of about $10^{11}$ to $10^{20}$ atoms/cm$^2$ at an energy of about 5 KEV to 3 MEV into body 230. The completed trigger device is illustrated in FIG. 6B and described infra.

Figure 5C:
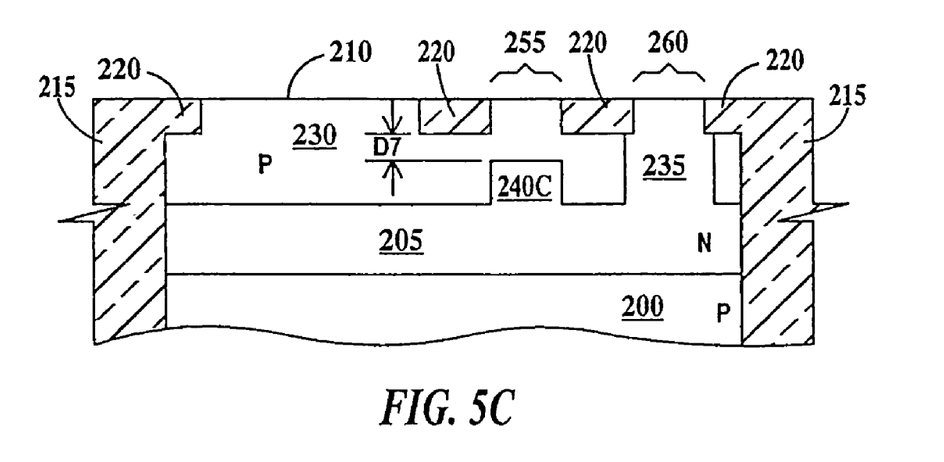
FIG. 5C is a partial cross-sectional view illustrating formation of a structure of a third embodiment of the present invention, common to all methods of fabricating the trigger device of the present invention.

FIG. 5C is a partial cross-sectional view illustrating formation of a structure of a third embodiment of the present invention, common to all methods of fabricating the trigger device of the present invention. In FIG. 5C, a modulator extension 240C is formed between region 255 where a body contact will be formed and a region 255 where a modulator contact will be formed. An N-type ion implant of a dose of about $10^{12}$ to $10^{20}$ atoms/cm$^2$ at an energy of about 5 KEV to 1 MEV is performed to form modulator extension 240C a distance "D7" from top surface 210 of substrate 200. In one example, "D7" is about 0 to 2 microns. Formation of modulator extension 240C is followed by a P-well P-type ion implant of a dose of about $10^{11}$ to $10^{20}$ atoms/cm$^2$ at an energy of about 5 KEV to 3 MEV into body 230. The completed trigger device is illustrated in FIG. 6C and described infra.

Thus, FIGS. 5A, 5B and 5C illustrate three different positions where a modulator extension may be formed.

Figure 6B:
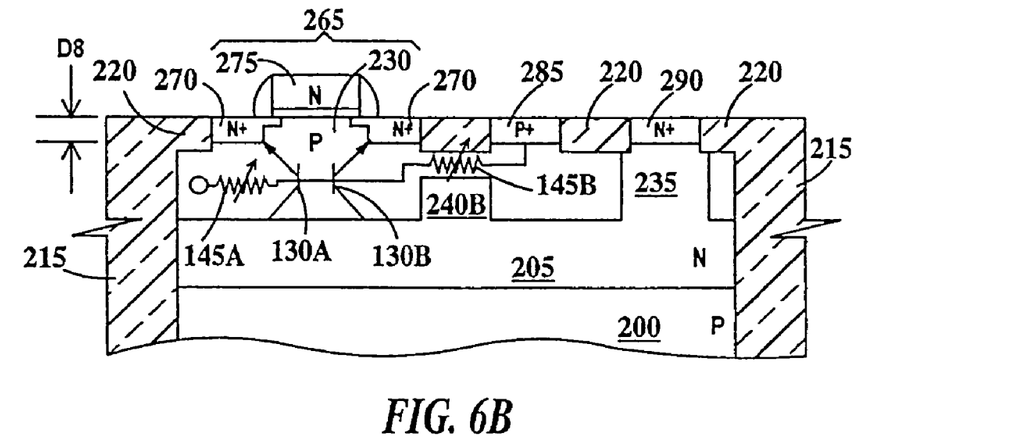
Figure 6C:
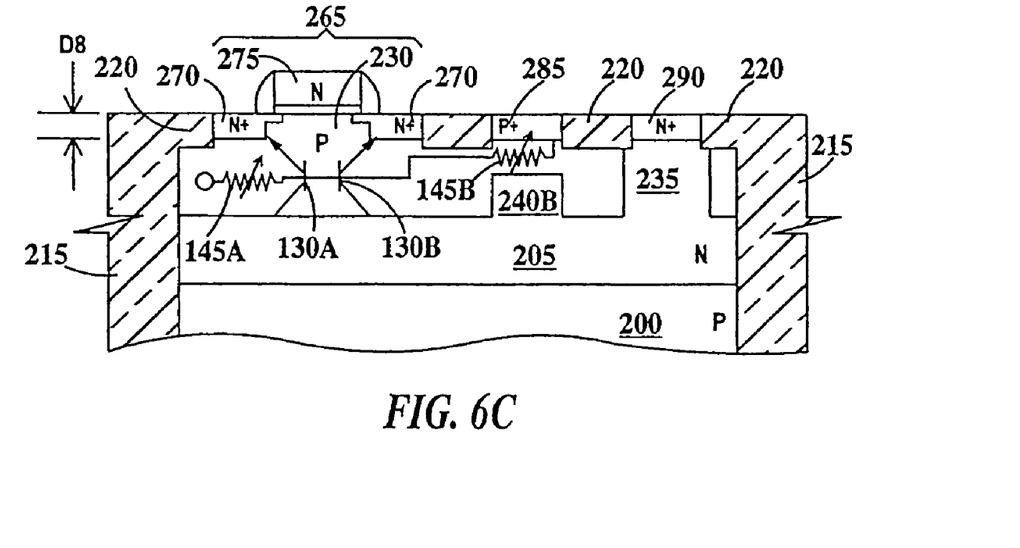

FIGS. 6A, 6B and 6C are a partial cross-sectional views illustrating completion respectively of the first, second and third embodiments of the present invention, common to all methods of fabricating the trigger device of the present invention. In FIGS. 6A, 6B, and 6C, an NFET 265 comprising source/drains 270, gate 275 and body 230 is formed by any number of methods well known to one of ordinary skill in the art. In one example, source/drains 270 are formed by an N-type ion implant of a dose of about $10^{12}$ to $10^{20}$ atoms/cm$^2$ at an energy of about 3 KEV to 100 KEV to a depth of "D8." In one example, "D8" is about 0.05 to 0.5 microns. The deeper the implant, the higher the resistance of the resulting resistors 145A and 145B. Likewise, a P+ body 285 contact and an N+ modulator contact 290 are formed to body region 230 and reach through 235 respectively.

In FIGS. 6A, 6B and 6C, application of a bias voltage to modulator 205 and modulator extension 240A has the dual effect of increasing the resistance of resistors 145A and 145B and reducing the base width (and hence turn on voltage) of NPNs 130A and 130B. However, the effect of reducing base width has much more effect in FIG. 6A than in FIGS. 6B and 6C.

Electrical modulation of body 230 by modulator 205 occurs when a voltage bias is applied between modulator 230 and body 205. This causes a depletion zones to extend out from modulator 230 into body 205, reducing the vertical thickness of body 230 and increasing the lateral resistance of the body. These two effects define electrical modulation of body 230 by modulator 205.

It should be noted that formation of modulator extensions 240A, 240B and 240C are optional and by selecting distance "D1" of FIG. 3B or distance D3 and/or distance D4 of FIG. 4B, the resistance of variable resistors 145A and 145B and base width of NPNs 130A and 130B can be controlled, thus controlling the gate voltage at which modulation breakdown occurs. This type of trigger device is illustrated in FIG. 7 and described infra.

Figure 7:
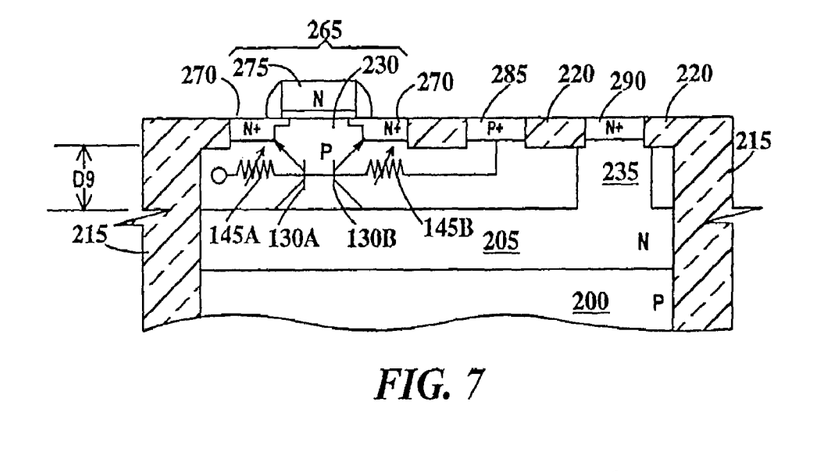
FIG. 7 is a partial cross-section view of a completed trigger device according to a fourth embodiment of the present invention.

FIG. 7 is a partial cross-section view of a completed trigger device according to a fourth embodiment of the present invention. FIG. 7A is similar to FIG. 6A, except there is no modulator extension. Trigger voltage is controlled by controlling the distance "D9" between modulator 205 and source/drains 270.

Figure 8:
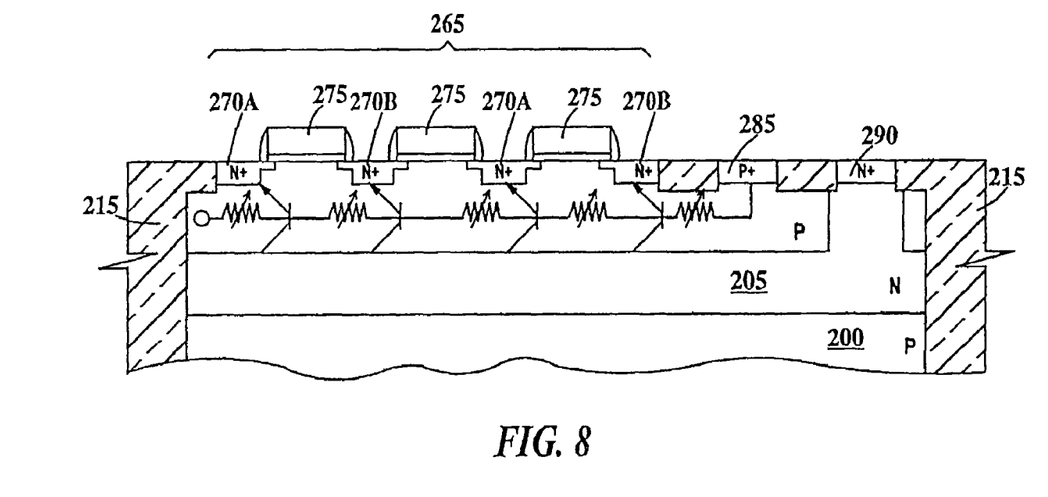
FIG. 8 is a partial cross-section view of a completed trigger device according to a fifth embodiment of present invention.

FIG. 8 is a partial cross-section view of a completed trigger device according to a fifth embodiment of present invention. In FIG. 8, NFET 265 includes multiple source fingers 270A, multiple drain fingers 270B and multiple gate fingers 275. Modulation breakdown occurs because of the sum of the leakage of all the NPNs exceeds a threshold current. In one experiment, a 4-finger trigger device had a modulation breakdown voltage of 5.5 volts and a similar 16-finger trigger device had a modulation breakdown voltage of 4.0 volts.

Figure 9A:
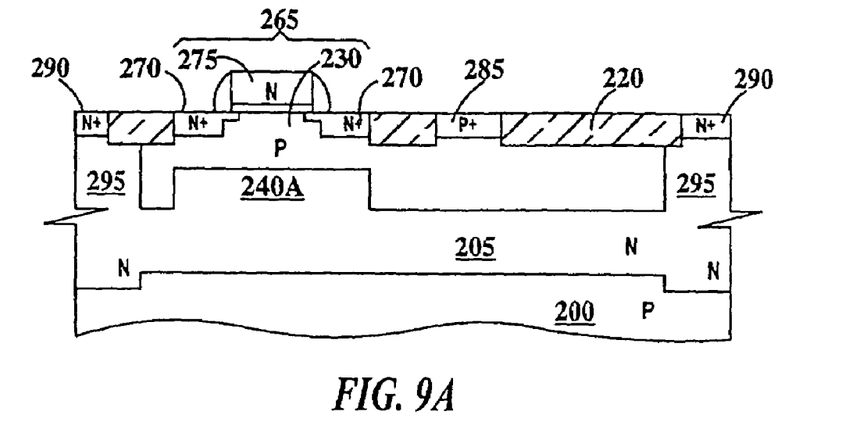
FIGS. 9A, 9B and 9C are partial cross-section views of a completed trigger device according to respectively a sixth, seventh and eight embodiment of the present invention.
Figure 9B:
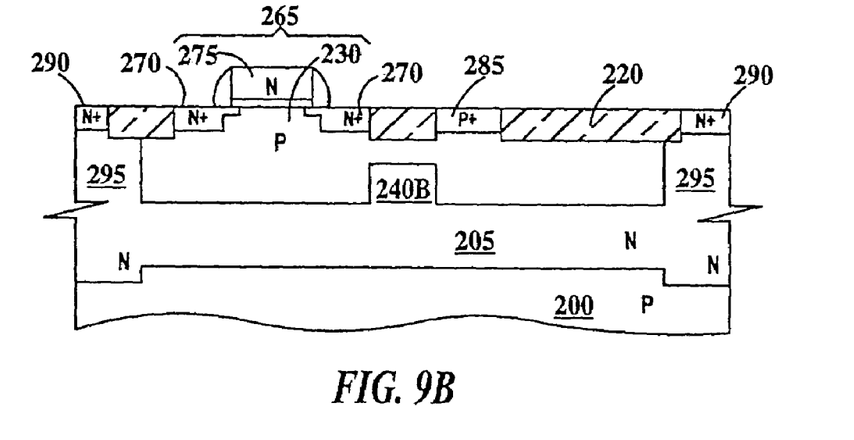
Figure 9C:
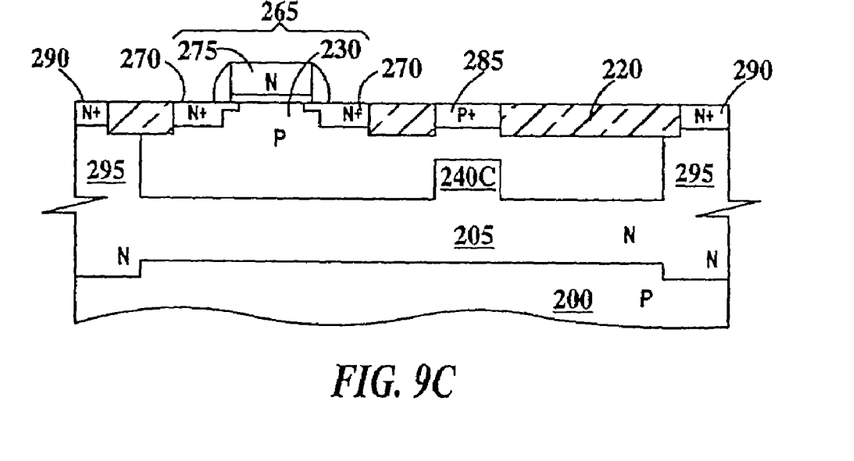

FIGS. 9A, 9B and 9C are a partial cross-section views of a completed trigger device according to respectively a sixth, seventh and eight embodiment of the present invention. FIG. 9A is similar to FIG. 6A, except deep trench isolation 215 (see FIG. 6A) is replaced with diffused isolation 295 and no reach through 235 is required (see FIG. 6A). Modulator contact 290 is formed to isolation 295. FIG. 9B is similar to FIG. 6B except deep trench isolation 215 is replaced with diffused isolation 295 and no reach through 235 is required (see FIG. 6A). Modulator contact 290 is formed to isolation 295. FIG. 9C is similar to FIG. 6C except deep trench isolation 215 is replaced with diffused isolation 295 and no reach through 235 is required (see FIG. 6C). Modulator contact 290 is formed to isolation 295.

Diffused isolation 295 will have a small effect on the gate voltage that will cause modulation breakdown to occur at a lower voltage than with a deep trench isolation as body 230 will become slightly smaller as a depletion zone grows around diffused isolation 295 and some leakage current will flow from the source/drain to modulator 205 through diffused isolation 295.

In addition to deep trench isolation and diffused isolation, the present invention may be practices with trench isolation (TI) technology, where the deep trench is formed after the NFET is fabricated, but before interconnection contact formation. The present invention may also be practiced in single, double and triple well CMOS technology as well as SiGe and SiGeC BiCMOS technology. The present invention may be practiced on bulk silicon, silicon on insulator (SOI) and GaAs substrates.

Figure 10:
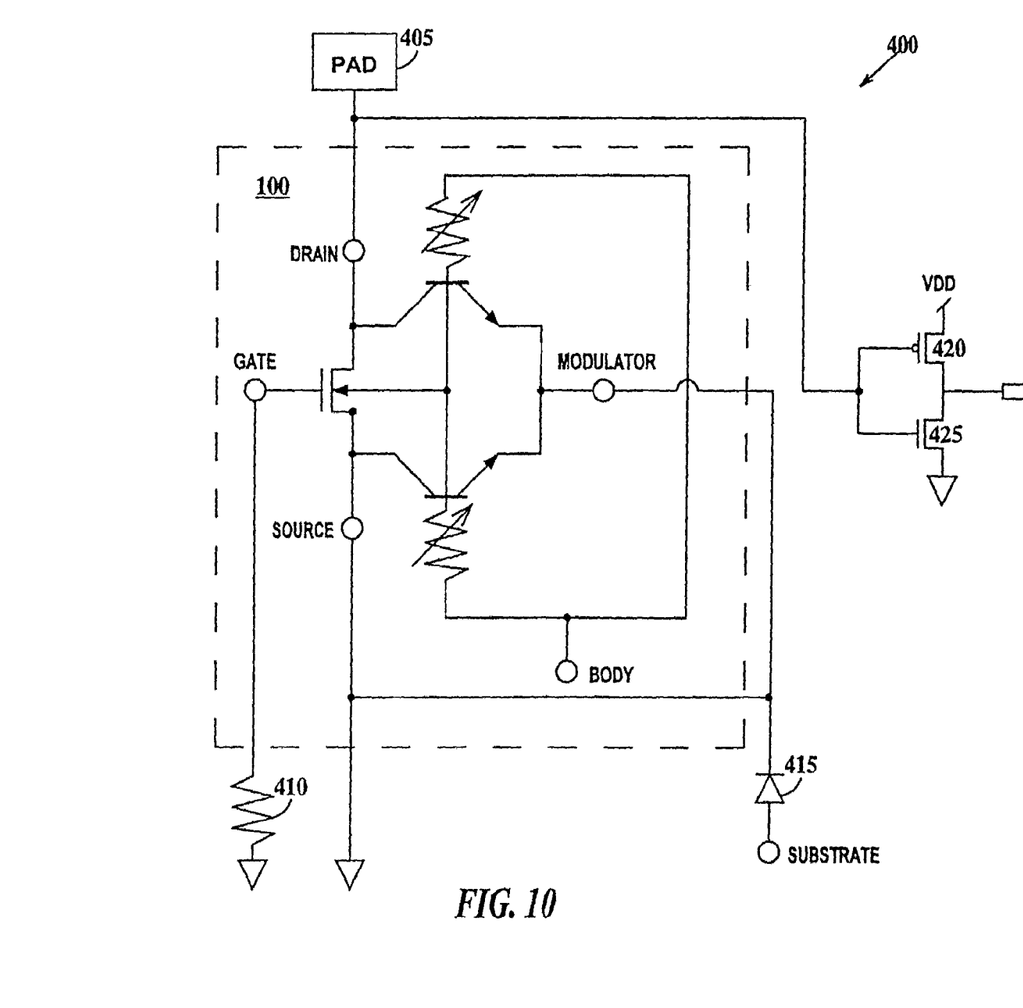
FIG. 10 is a first exemplary ESD protection circuit utilizing a trigger device according to the present invention.

FIG. 10 is a schematic diagram of a first exemplary ESD protection circuit utilizing trigger device 100 according to the present invention. In FIG. 10, ESD circuit 400 includes trigger device 100, an I/O pad 405, a resistor 410, a diode 415, a PFET 420 and an NFET 425. The drain connection of trigger device 100 is connected to pad 405 and to the gates of PFET 420 and NFET 425. The modulator connection of trigger device 100 is connected to substrate through diode 415. The source of trigger device 100 is connected to ground and to the modulator contact of the trigger device. The gate of trigger device 100 is connected to ground through resistor 410. The source of PFET 420 is connected to VDD and the source of NFET 425 is connected to ground. The drains of PFET 420 and NFET 425 are the protected input/output gate of ESD circuit 400.

Figure 11:
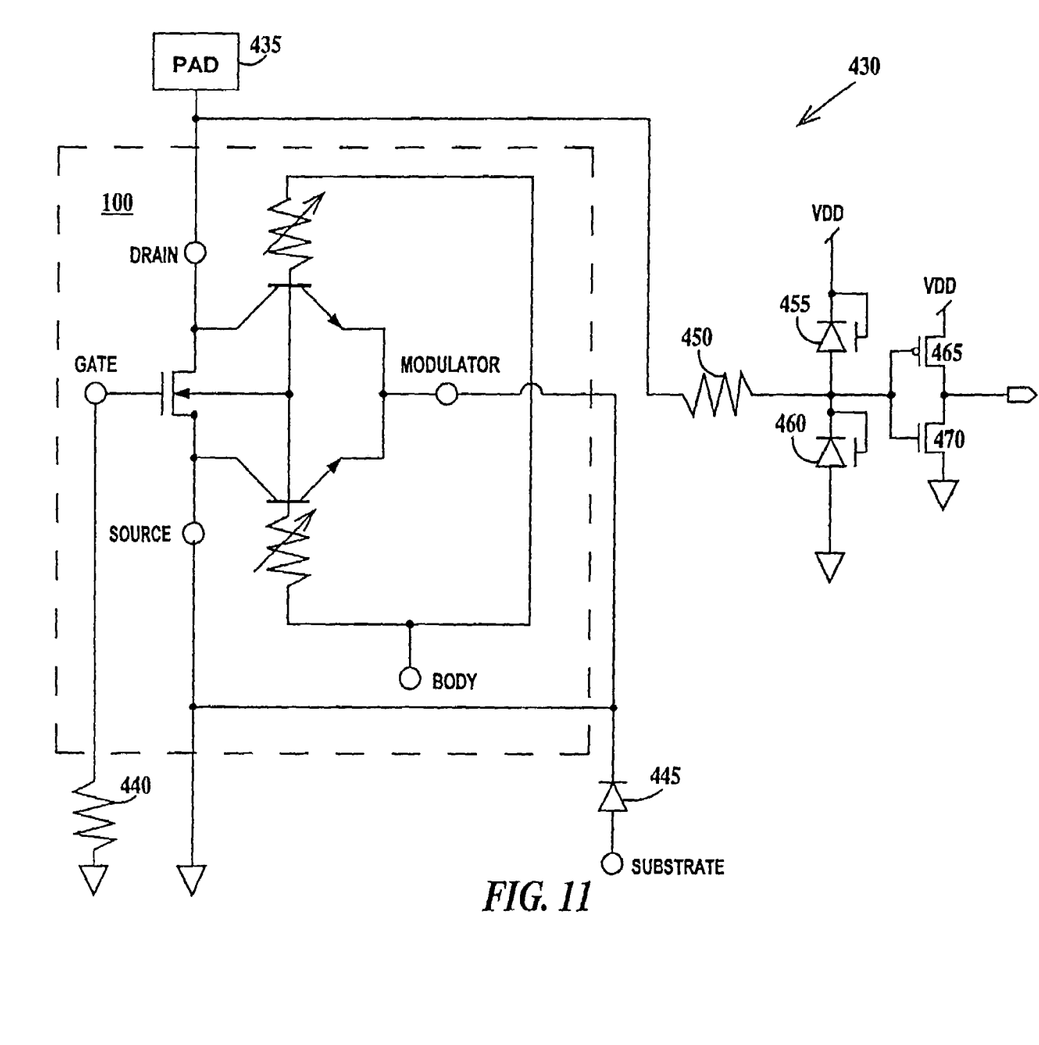
FIG. 11 is a second exemplary ESD protection circuit utilizing a trigger device according to the present invention.

FIG. 11 is a schematic diagram of second exemplary ESD protection circuit utilizing trigger device 100 according to the present invention. In FIG. 11, ESD circuit 430 includes trigger device 100, a pad 435, a resistor 440, a diode 445, double gated diodes 455 and 460, a PFET 465 and an NFET 470. The drain of trigger device 100 is connected to pad 435 and through resistor 450 to the anode of diode 455, the cathode of diode 460 and the gates of PFET 465 and NFET 470. The modulator contact of trigger device 100 is connected to substrate through diode 445. The source of trigger device 100 is connected to ground and to the modulator contact of the trigger device. The gate of trigger device 100 is connected to ground through resistor 440. The cathode of diode 455 and the source of PFET 465 are connected to VDD and the anode of diode 460 and the source of NFET 470 are connected to ground. The drains of NFET 465 and NFET 470 are the protected input/output gate of ESD circuit 430.

Figure 12:
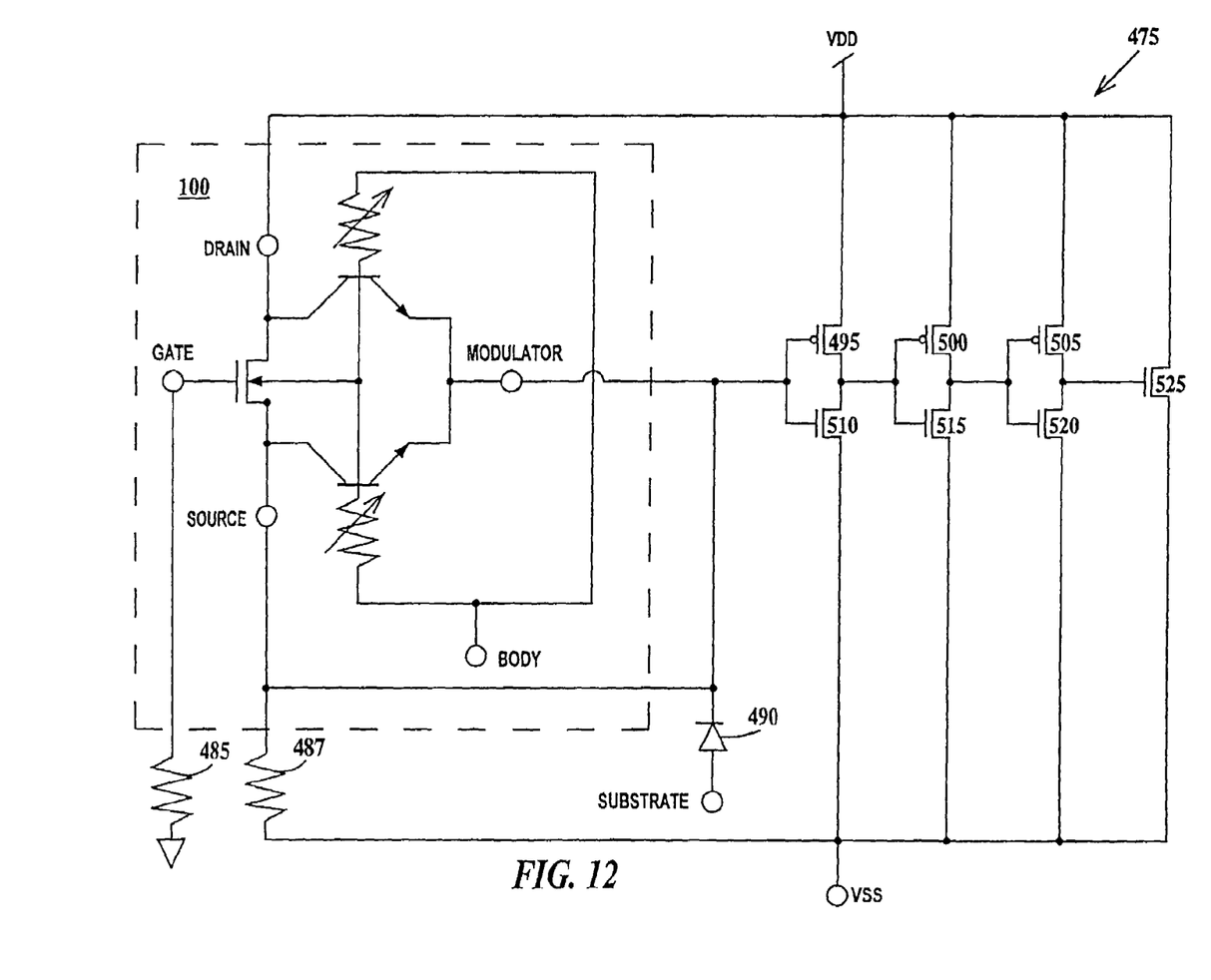
FIG. 12 is an exemplary ESD protected voltage clamp circuit utilizing a trigger device according to the present invention.

FIG. 12 is an exemplary ESD protected voltage clamp circuit utilizing trigger device 100 according to the present invention. In FIG. 12, clamp circuit 475 includes trigger device 100, a pad 480, resistors 485 and 487, a diode 490, PFETs 495, 500 and 505 and NFETs 510, 515, 520 and 525. The drain of trigger device 100 is connected to VDD as are the sources of PFETs 495, 500 and 505 and the drain of NFET 525. The modulator of trigger device 100 is connected to the gates of PFET 495 and NFET 510. The source of trigger device 100 is connected to ground through resistor 487 as well as to the modulator contact of the trigger device. The gate of trigger device 100 is connected to ground through resistor 485. The modulator of trigger device 100 is also connected to substrate through diode 490. The sources of NFETs 510, 515, 520 and 525 are connected to ground. The drains of PFET 495 and NFET 510 are connected to the gates of PFET 500 and NFET 515. The drains of PFET 500 and NFET 515 are connected to the gates of PFET 505 and NFET 520. The drains of PFET 505 and NFET 520 are connected to the gate of NFET 525.

Figure 13:
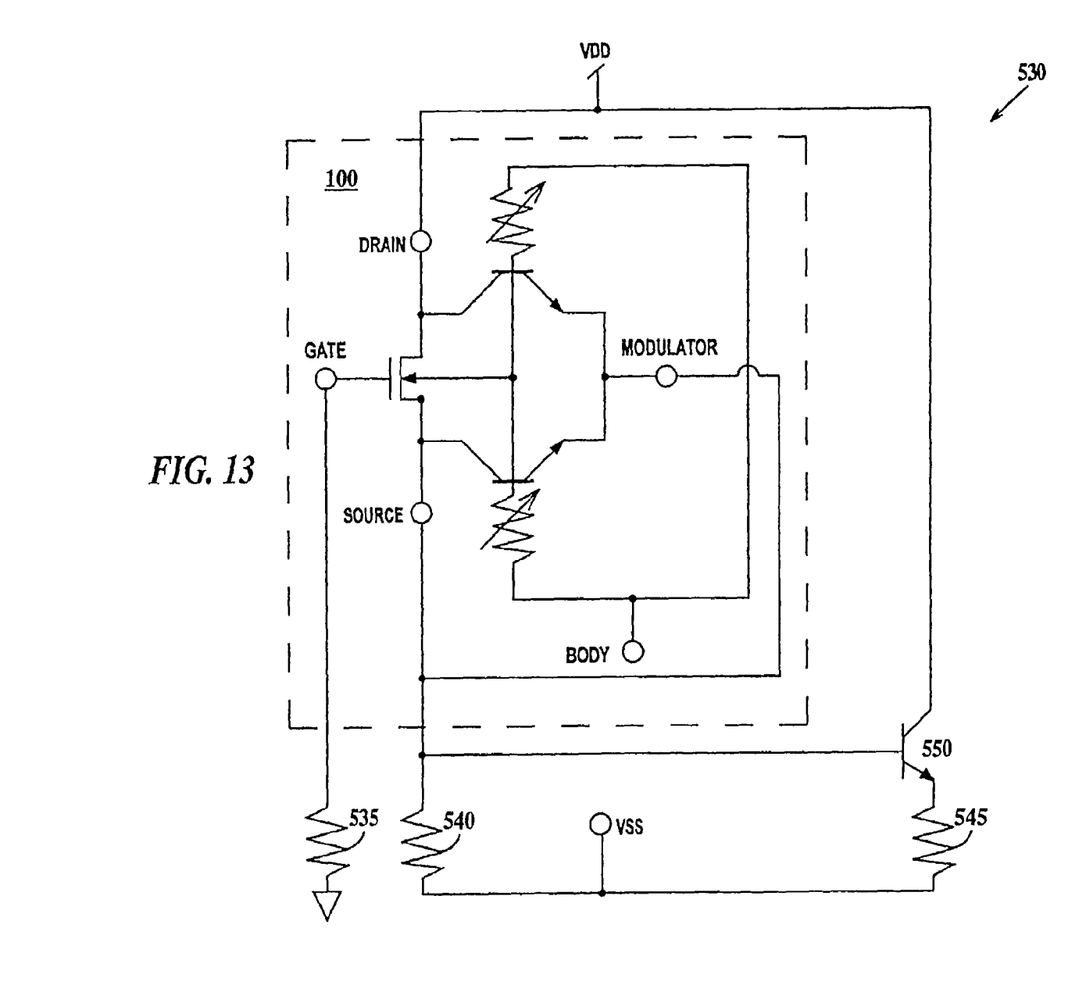
FIG. 13 is an exemplary ESD protected voltage clamp circuit for SiGe applications utilizing a trigger device according to the present invention.

FIG. 13 is an exemplary ESD protected voltage clamp circuit for SiGe applications utilizing a trigger device according to the present invention. In FIG. 13, clamp circuit 530 includes trigger device 100, resistors 535, 540 and 545 and a SiGe NPN bipolar transistor 550. The drain connection of trigger device 100 is connected to VDD and to the collector of NPN 550 425. The modulator connection of trigger device 100 is connected to the source contact of the trigger device, the base of NPN 550 and to VSS through resistor 540. The gate of trigger device 100 is connected to ground through resistor 535. The emitter of NPN is connected to VSS through resistor 545.

Therefore, the present invention provides a compact trigger device having a precisely set trigger voltage that may be integrated into a variety of technologies including but not limited to CMOS, BiCMOS, BiCMOS Si, BiCMOS SiGe and BiCMOS SiGeC.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A method of electrostatic discharge protection, comprising:

providing trigger device comprising:
a MOSFET having a source, a drain, a gate and a body in a substrate;
a modulator under and in contact with said body;
a body contact and a modulator contact, said body contact separated from said source, said drain and said modulator contact by dielectric isolation formed in said body; said modulator contact separated from said source and said drain by said dielectric isolation, said source and drain extending from a top surface of said body into said body a first distance, said body contact extending from said top surface of said body into said body a second distance, said dielectric isolation extending from said top surface of said body into said body a third distance, said third distance greater than said first or second distances;
a first vertical bipolar transistor comprising said source, said body and said modulator; and
a second vertical bipolar transistor comprising said drain, said body and said modulator;
coupling said modulator contact to said substrate and to said source;
coupling said drain to an I/O pad and to (i) a double gated diode pair and an input gate network or to (ii) a clamping network; and
coupling said source to said substrate.

2. The method of claim 1, further including, applying a bias voltage to said modulator to change the forward biases on said first and second vertical bipolar transistors.

3. The method claim 1, further including, applying a bias voltage to said modulator to change the lateral resistance of said body.

4. The method of claim 1, further including coupling said gate and said source to ground.

5. The method of claim 1, said trigger device further including:
a first junction between said body and said modulating layer under said source and said drain is a fourth distance from said top surface of said body; and
a second junction of said body and said modulating layer under said dielectric isolation and said body contact is a fifth distance from said top surface of said body, said fifth distance greater than said fourth distance.

6. The method of claim 1, said trigger device further including:
a first junction between said body and said modulating layer under said source, said drain and a first region of said dielectric isolation is a fourth distance from said top surface of said body; and a second junction of said body and said modulating layer under said a second region of said dielectric isolation is a fifth distance from said top surface of said body, said second region of said dielectric isolation disposed between said source and said body contact or disposed between said drain and said body contact, said fourth distance greater than said fifth distance.

7. The method of claim 1, said trigger device further including:

a first junction between said body and said modulating layer under said source, said drain and said dielectric isolation is a fourth distance from said top surface of said body; and a second junction of said body and said modulating layer under said body contact is a fifth distance from said top surface of said body, said fourth distance greater than said fifth distance.

* * * * *